United States Patent
Chen et al.

(10) Patent No.: US 6,587,997 B1
(45) Date of Patent: Jul. 1, 2003

(54) AUTOMATIC RESISTANCE AND CAPACITANCE TECHNOLOGY FILE GENERATOR FOR MULTIPLE RC EXTRACTORS

(75) Inventors: Steven Chen, Hsin-Chu (TW); Cliff Hou, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 200 days.

(21) Appl. No.: 09/905,407

(22) Filed: Jul. 16, 2001

(51) Int. Cl.[7] .............................................. G06F 17/50
(52) U.S. Cl. ..................... 716/4; 716/3; 716/5; 716/6
(58) Field of Search ............................... 716/4, 3, 5, 6, 716/19, 20

(56) References Cited

U.S. PATENT DOCUMENTS

| | | | |
|---|---|---|---|
| 5,452,224 A | 9/1995 | Smith, Jr. et al. | ............ 364/488 |
| 5,706,206 A | 1/1998 | Hammer et al. | ............ 364/489 |
| 5,999,010 A | 12/1999 | Arora et al. | ................ 324/765 |
| 6,009,252 A | 12/1999 | Lipton | ................... 395/500.06 |
| 6,212,666 B1 * | 4/2001 | Gohl et al. | ...................... 716/6 |
| 6,272,664 B1 * | 8/2001 | Chang et al. | .................. 716/3 |
| 6,467,068 B1 * | 10/2002 | Iyer et al. | ....................... 716/6 |

OTHER PUBLICATIONS

"Verification of Circuits Described in VHDL Through Extraction of Design Intent," Hoskote et al., Proceedings of the Seventh Int'l Conference of VLSI Design, IEEE, Jan. 1994, pp. 417–420.

"Efficient Net Extraction for Restricted Orientation Designs (VLSI Layout)," Lopez et al., IEEE Transactions on Computer Aided Design of Integrated Circuits and Systems, Sep. 1996, vol. 15, Issue: 9 ISSN: 0278–0070; pp. 1151–1159.

* cited by examiner

*Primary Examiner*—Vuthe Siek
*Assistant Examiner*—Brandon Bowers
(74) *Attorney, Agent, or Firm*—George O. Saile; Stephen B. Ackerman; Billy Knowles

(57) ABSTRACT

A method for generating technology data files for use by at least one chip and circuit analysis tools begins by accepting a user analysis request for a specific chip and circuit analyses. The design automation tool required for the requested analysis is then selected. A standard, generic technology data file(TDF) is converted to a custom TDF specified for a given design analysis tool from a set of TDF formatting rules for the given design analysis tool. The chip coordinate references, process parameters and line segment layout data to be tested are extracted from a physical design data layout file. The line segment layout data of a standard wafer test site for the foundry/process selected is extracted from a circuit simulation model of the desired foundry/process. The design automation tool is executed using the foundry/process and line segment layout data as requested in the user analysis request. An analysis specified by said user analysis request with the selected design automation tool is executed using the foundry/process and line segment layout data of the standard wafer test site. The results of the analysis using the foundry/process and line segment layout data of the standard wafer test site are compared with the actual data describing the test site function. Reports are issued describing the success of the analysis.

8 Claims, 8 Drawing Sheets

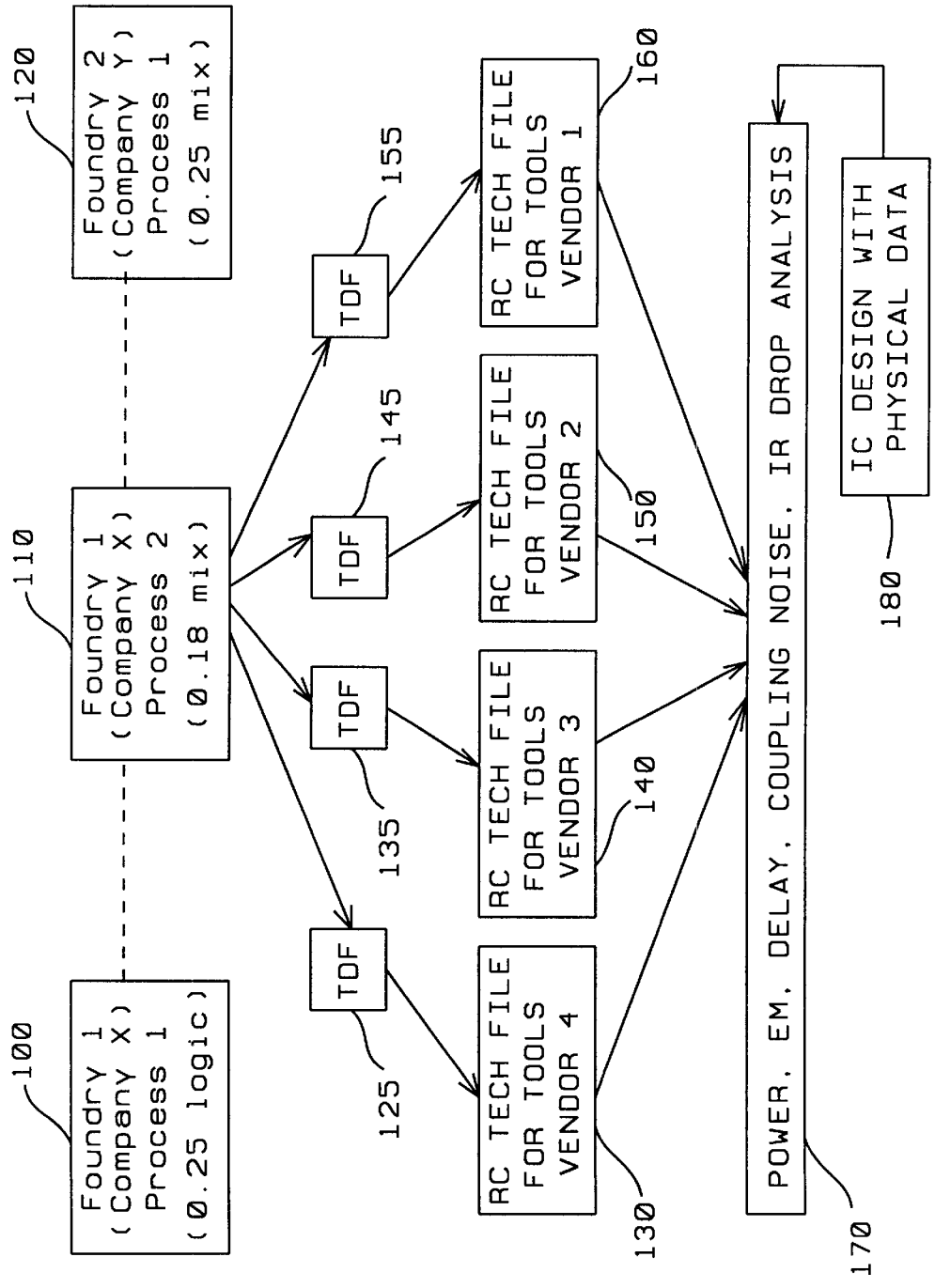
FIG. 1 – Prior Art

```
//A generic technology file
//nonplanar
header
{
-Technology name
-Case
WORSE
-Title
TECH. FILES
-Revision Date
-Spice
-Author
}
```

*FIG. 2a – Prior Art*

```
dielectric-layer
{
//top to down
//unit um
//type D:dielectric, C:conductor, F:diffusion P:conformal passivation
//name  type  die-C  Thick  variation(%)
CPASS2   P    7.9    0.7    10
CPASS1   P    4.2    1.0    10
PASS2    D    7.9    0.7    10
PASS1    D    4.2    1.04   10
IMD6b    D    4.2    0.20   10
IMD6a    D    3.6    1.13   20
IMD5b    D    4.2    0.15   10
IMD5a    D    3.6    1.08   20
IMD4b    D    4.2    0.15   10
IMD4a    D    3.6    1.08   20
IMD3b    D    4.2    0.15   10
IMD3a    D    3.6    1.08   20
IMD2b    D    4.2    0.15   10
IMD2a    D    3.6    1.08   20
IMD1b    D    4.2    0.15   10
IMD1a    D    3.6    0.96   20
ILD      D    4.0    0.60   25
FOX      D    3.9    0.35   17.1
}
diffusion - layer
{
//name  type  depth  Thick  Min.W  Min.S  resist  bias
NOD      F    3.9    0.35   0      0      4.7
POD      F    3.9    0.35   0      0      4.6
OD       F    3.9    0.35   0      0      4.7
}
```

FIG. 2b — Prior Art    400

```
conductor-layer
{
//name      type  height  Thick  Min.W  Min.S  resist  bias    above  diff  3d1  3d2
metal7      C     8.31    0.99   0.44   0.46   0.036   0       imd6b  0     10   10
metal6      C     6.98    0.53   0.24   0.24   0.078   0       imd5b  0     10   10
metal5      C     5.75    0.53   0.24   0.24   0.078   0       imd4b  0     10   10
metal4      C     4.52    0.53   0.24   0.24   0.078   0       imd3b  0     10   10
metal3      C     3.29    0.53   0.24   0.24   0.078   0       imd2b  0     10   10
metal2      C     2.06    0.53   0.24   0.24   0.078   0       imd1b  0     10   10
metal1      C     0.95    0.41   0.19   0.20   0.125   0       ILD    0     10   10
poly        C     0.35    0.18   0.15   0.22   7.8     -0.035  FOX
substrate   C     0
}
via
{
//name      ohm/ct  width  Length  low-M   upper-M
polyCont    13.5    0.18   0.18    poly    metal1
via1        8.5     0.22   0.22    metal1  metal2
via2        8.5     0.22   0.22    metal2  metal3
via3        8.5     0.22   0.22    metal3  metal4
via4        8.5     0.22   0.22    metal4  metal5
via5        8.5     0.22   0.22    metal5  metal6
via6        2.54    0.36   0.36    metal6  metal7
}
```

AUTOMATIC RESISTANCE AND CAPACITANCE TECHNOLOGY FILE GENERATOR FOR MULTIPLE RC EXTRACTORS

BACKGROUND OF THE INVENTION

1. Field of the Invention

This invention relates to the gathering of resistance and capacitance data from integrated circuit designs from multiple foundries as input to computer aided design tools, which can provide circuit analyses. These analyses include coupling noise, electromagnetic interference generation, power dissipation, and resistive voltage drop. More particularly, this invention relates to the automatic generation of resistive/capacitive technology data files, which are converted to formats usable by computer aided design analysis programs from a generic technology file.

2. Description of Related Art

Today, integrated circuit designers must use design automation tools for analysis of semiconductor circuits. The various analyses 170 include noise coupling analysis, resistive voltage drop calculation, determining electromagnetic interference effects, circuit delay calculation, and power dissipation analysis. These analysis tools come from different design automation tool providers. As shown in FIG. 1, a typical circuit designer may deal with multiple foundries 100, 110, 120 to fabricate their designs. Each foundry 100, 110, 120 provides the process parameters that determine the resistivity and dielectric contants of the materials employed in fabricating an integrated circuit in the semiconductor process. The foundries may differ in their minimum possible line widths or in the type of dielectric material used to make capacitors for example. In addition, the circuit designer utilizes computer aided design analysis applications or tools 130, 140, 150, 160 from different vendors. It is the designer's responsibility to supply the required input information, such as resistivity, dielectric, and other physical properties) from the semiconductor foundries to the computer aided analysis tools. The results from the analysis tools are only accurate and useful if the required material properties are accurate and correct. Typically, the circuit designer has to manually prepare technology data files which gather information such as the resistivity, dielectric constants, wiring lengths and widths, oxide thickness from the foundries 100, 110, 120 and provide this information in the varied formats required by the different computer aided analysis tools providers. As shown in FIG. 1, four different Technology Data Files (TDF) 125, 135, 145, 155 may be required per chip coming from a single foundry. If the chip is fabricated at two foundries, the number of TDF files the circuit designer must generate would be eight. If the chip is fabricated at three foundries, the number of TDF files the designer must generate would be twelve, as shown.

Referring now to FIGS. 2a, 2b, and 2c for a discussion of the information contained within a technology description file (TDF) 400 necessary for calculation of capacitance and resistance of semiconductor structures that form integrated circuits. FIG. 2a illustrates a header structure for a TDF 400. The header structure provides a technology name describing the process to be used within the foundry 100, 110, 120 described by the technology data file 400. The header has a label for the tolerance level or CASE of the detail dimensions of the technology described. The tolerance level or CASE will either be "normal," "best", or "Worst" case. The header further contains a title detailing more information about the process of the foundry 100, 110, 120. The header also contains a revision code and data to chronicle changes in the TDF 400. The intended modeling tool is described. In this example SPICE, a circuit level simulation program well known in the art, is named as the target modeling tool. The SPICE circuit model description file is the source of the TDF. The name of the author(s) of the TDF 400 identifies the person responsible for creating and revising the TDF 400.

FIG. 2b describes the contents of the TDF 400 for the dielectric insulation layers used to isolate conductive layers used in forming and interconnecting the electronic components of the integrated circuit. The statement demarcated by the double backward slash marks (//) indicate comments describing the fields of the TDF 400. The text //type describes the type of material specified. The dielectric material is denoted with a D, a conductor is denoted with a C, the diffusion layers are noted with an F, and a passivation layer is denoted with a P.

The dielectric constant (die-c) is itemized for each type of insulating material by layer that is used. The thickness is described, as is the variation in the thickness as a percentage of the thickness.

The diffusion layers are described giving the depth within the semiconductor substrate for the diffusion, the minimum thickness of the diffusion, the minimum dimensions (MinW) of the diffusion, the minimum spacing (MinS) between diffusions, the resistivity of the diffusion material, and a bias or difference between the designed or drawn dimensions and the actual fabricated dimensions.

FIG. 2c illustrates the TDF 400 entries for conductors placed on a semiconductor substrate to interconnect the electronic devices of the integrated circuit and to form the gate structures of field effect transistors (FET's) of the integrated circuit. The specification of the TDF 400 for conductors include the height above the substrate for each conductor, the thickness of the conductors, the minimum dimensions (MinW) of the conductor, the minimum spacing between conductors (MinS), the resistivity of the conductors, a bias factor for the difference between the designed or drawn dimensions and the actual dimensions, the overlaying dielectric layer (ABOVE), and the variations as a percentage of the thickness and width of the conductor (3d1, 3d2).

The description of the via contacts or interlayer connection for conductors includes the resistance (ohm/ct) for each via contact, the width and length of the via contact, the name of the lower conductor (low-m), and the name of the upper conductor (upper-m).

As is understood by a person skilled in the art, the TDF 400 as shown provide sufficient information for calculating the resistance of the conductive layers and the diffusions, and the capacitance formed between any of the conductive layers. Further, the TDF 400, as shown, is used as a source document and is translated to the format acceptable as technology files for commercially available computer aided design programs "Verification of Circuits Described in VHDL Through Extraction of Design Intent," Hoskote et al, Proceedings of the Seventh International Conference on VLSI Design, IEEE, January, 1994, pp. 417–420, describes a verification framework to verify VHDL designs from the scheduled behavioral level down to the gate level by capturing the design intent, on the basis of a formal semantics, in a form appropriate for input to the verifier.

"Efficient Net Extraction for Restricted Orientation Designs [VLSI Layout]," Lopez et al., IEEE Transactions on Computer-Aided Design of Integrated Circuits and Systems, Sept. 1996 Vol. 15 Issue: 9 ISSN: 0278–0070, pp. 1151–1159 describes an algorithm to extract a physical net description based on the intersections of connections within a net.

U.S. Pat. No. 6,009,252 (Lipton) teaches a layout versus schematic(LVS) comparison tool determines one-to-one equivalency between an integrated circuit schematic and an integrated circuit layout by performing operations to generate color symmetric matrices corresponding to respective child cells in the integrated circuit schematic.

U.S. Pat. No. 5,452,224 (Smith, Jr. et al.) describes a method for computing parasitic capacitances between multiple electrical conductors within an electric circuit. The parasitic capacitances associated with the conductors of each window are computed, and the results for the various windows combined into a matrix of parasitic capacitances for the overall circuit.

U.S. Pat. No. 5,706,206 (Hammer, et al.) describes a method for extracting parasitic capacitance values from the physical design of an integrated circuit. More particularly, lateral coupling and fringing capacitance values are extracted from the physical design of an integrated circuit.

U.S. Pat. No. 5,999,010 (Arora, et al.) describes a method for measuring the coupling capacitance between two interconnects lines of an integrated circuit structure having a ground plane.

BRIEF SUMMARY OF THE INVENTION

It is an object of this invention to provide a method for providing a description of process dependent circuit parameters of integrated circuit technology that is acceptable to computer aided design tools from different design automation tool providers for automatically modeling and verifying integrated circuit designs.

To accomplish this and other objects, a method for generating technology data files for use by at least one chip and circuit analysis tools begins by accepting at least one user analysis request for a specific chip and circuit analyses. The specific chip and circuit analyses to be performed are power dissipation calculation, electromagnetic noise coupling determination, resistive voltage drop calculation, and circuit delay analyses. The design automation tool required for the requested analysis is then selected. A standard, generic technology data file(TDF) is converted to a custom TDF specified for a given design analysis tool from a set of TDF formatting rules for the given design analysis tool. The chip coordinate references, process parameters and line segment layout data to be tested are extracted from a physical design data layout file. The line segment layout data of a standard wafer test site for the foundry/process selected is extracted from a circuit simulation model of the desired foundry/process. The design automation tool is executed using the foundry process and layout data as requested in the user analysis request. An analysis specified by the user analysis request is executed with the selected design automation tool using the foundry process and layout data of the standard wafer test site. The results of the analysis using the foundry process and layout data of the standard wafer test site are compared with the actual data describing the test site function. An error report is issued to the circuit designer if the verification of the analysis of the standard test site fails to match the known test site result. However, a positive report is issued to the circuit designer if the verification the analysis of the standard test site does match the known test site result, The requested analysis results report is released for further use if the verification analysis of the standard test site does match the known test site result.

The method further provides a user interface to request the analysis type of specific circuit or set of interconnected circuits on a specific integrated circuit chip to be fabricated at a specific foundry, the integrated circuit chip coordinate reference and the line segment layout data, and the foundry process parameters and circuit coordinates on the chip. The requested analysis type, integrated circuit chip circuit coordinate reference and the line segment layout data, and the foundry process parameters and circuit coordinates on the chip is separated. and the analysis tool required to deliver the user analysis request is selected. The physical dimensions are prepared. The physical dimensions are the line lengths and line widths, line thickness, and oxide thickness from the line segment layout data of the circuit or circuits to be analyzed. The foundry chip circuit simulation model is extracted from the integrated circuit design database and a generic technology data file (TDF) is created from the circuit simulation model. A set of predetermined analysis results of a standard test site are extracted for verifying the results of the selected analysis.

BRIEF DESCRIPTION OF THE DRAWINGS

FIG. 1 is a system diagram of the prior art of resistance and capacitance technology file generation.

FIGS. 2a, 2b, and 2c details an example of a sample TDF from the prior art.

DETAILED DESCRIPTION OF THE INVENTION

Figure 3:
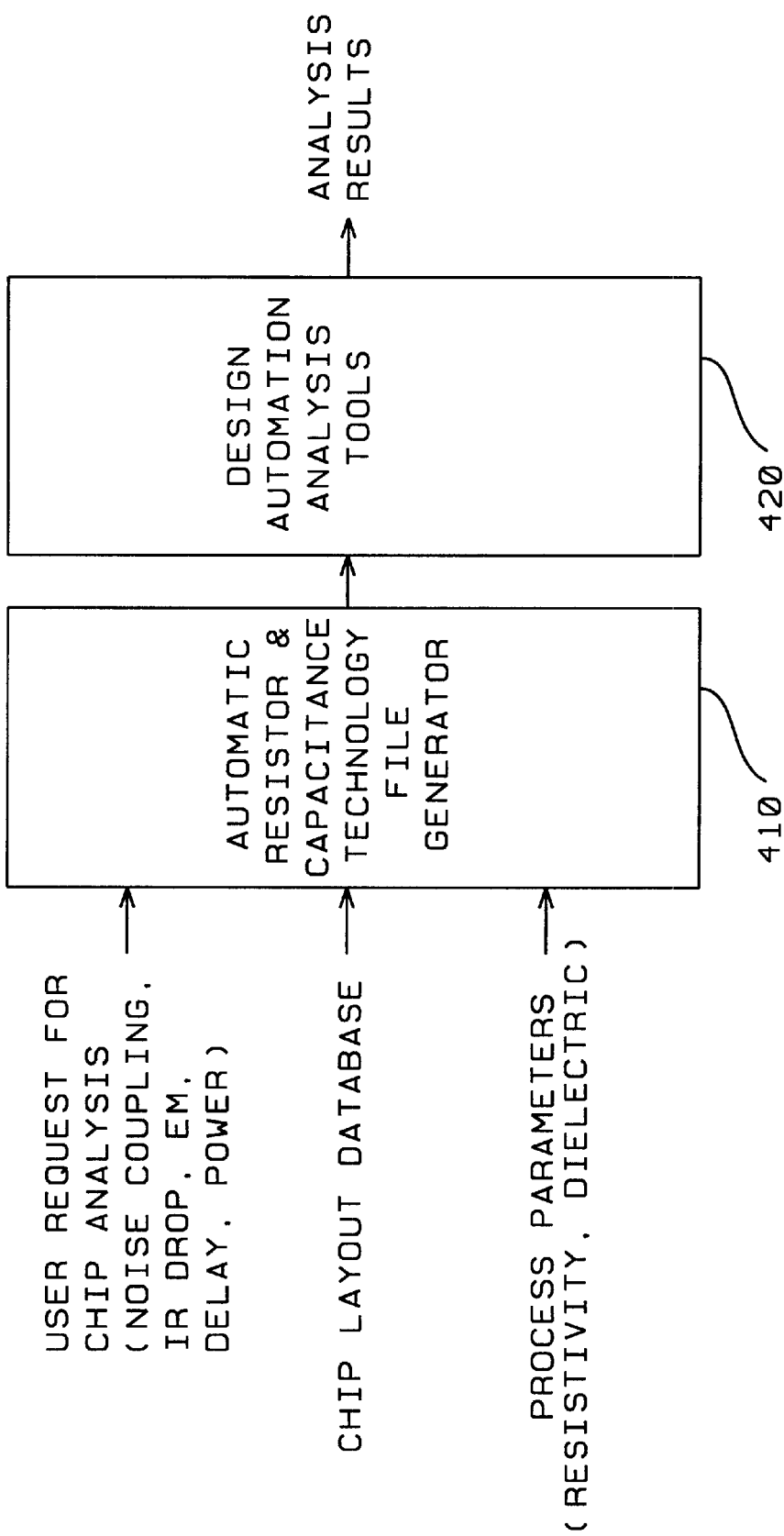
FIG. 3 is a high level system diagram of this invention.

FIG. 3 gives a high level system overview of this invention. The heart of the invention is the automatic resistance and capacitance technology file(TDF) generator 410. This TDF generator 410 accepts as input the circuit designer's request for circuit analysis (i.e. Noise, power, delay, IR drop, electromagnetic effects) on a particular circuit or circuits on a given chip design fabricated at a specific foundry. In addition, the TDF generator 410 accepts the desired chip layout database as input, The chip layout database contains a set of coordinates detailing a reference point on the surface of the semiconductor substrate. The chip layout data base further contains the coordinate description of each geometric segment that defines the electronic devices and the interconnecting conductors for the devices of the integrated circuit. The coordinate descriptions are made with reference to the reference point described. This chip layout data base provides a detailed drawing of all the electronic devices such as transistors, resistors, capacitors, and inductors, with the interconnecting diffusions, polycrystalline silicon, and metal conductors used on the semiconductor substrate to form the integrated circuit. The TDF generator 410 also accepts the process parameters (resistivity and dielectric constants) provided in the generic TDF 400 of FIGS. 2a, 2b, and 2c from the desired foundry as input. As described above, each foundry 100, 110, 120 provides the process parameters necessary to determine the resistance and capacitance of the materials forming the geometric segments of the electronic devices and interconnections of the integrated circuit. The output of the TDF generator 410 is a custom TDF which is acceptable to the particular design automation/analysis tool being used to calculate the analysis requested by the circuit designer. The custom TDF from the TDF generator 410 creates a technology description by extracting the necessary information from the generic TDF 400 of FIGS. 2a, 2b, and 2c, reformatting and reorganizing the generic TDF 400 information to the form acceptable by the desired design automation analysis tool 420. This custom TDF becomes input to the desired design automation analysis tool 420. The output of the design automation analysis tool as shown in FIG. 3 is the requested analysis results.

Figure 4:
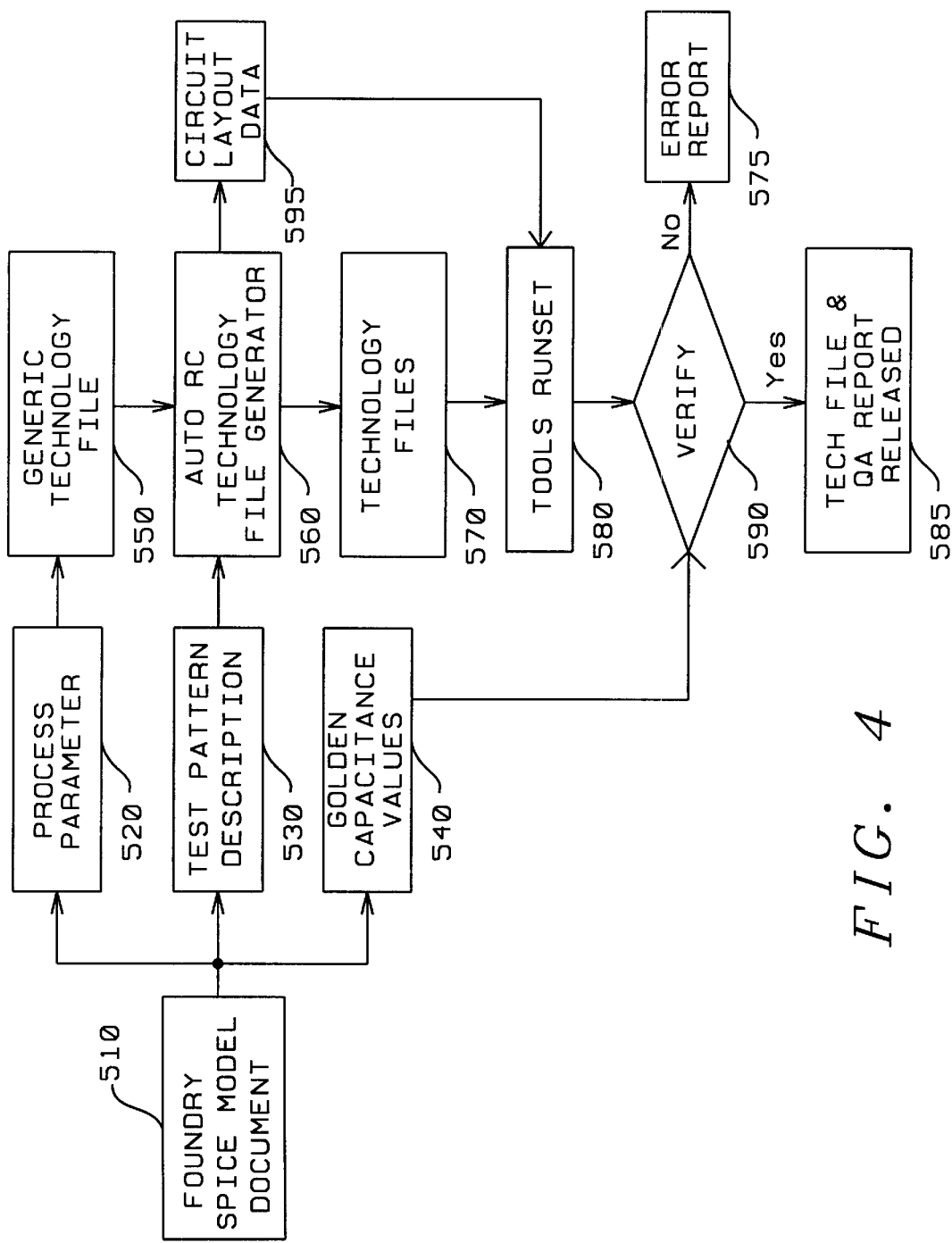
FIG. 4 is a detailed system diagram of this invention.

Refer now to FIG. 4 for a discussion of the system structure of this invention. The following discussion uses references to SPICE models. SPICE is a general-purpose circuit simulation program and modeling format for nonlinear dc, nonlinear transient, and linear ac analyses. The foundry SPICE model document 510 contains the source information required to answer the circuit designers request for a specific analysis on a specific circuit or circuits. The source information required includes dielectric constant, metal wiring resistivity, and diffusion resistivity. The process parameters 520 are extracted from the foundry model document. In addition, the physical dimensions of a standard test site test circuit or test pattern 530 is extracted from the SPICE model document. Also, the actual known capacitance values 540 of the standard test site test circuit are obtained from the SPICE model document. The process parameters 520 are used to compile a generic technology data file, TDF 550. The generic technology data file (TDF) 550 is as shown FIGS. 2a, 2b, and 2c. The generic TDF 550 is submitted to the automatic resistance/capacitance technology file generator 560. This is where the custom TDF files 570 are compiled for the specific design automation analysis tools desired. The circuit designer specifies a circuit or circuits to be analyzed by a certain design automation analysis tool. The layout information of specified circuit 595 is fed into the required design analysis tool 580 along with the TDF file 570 for analysis. In addition, the layout information 530 of the standard test site is analyzed following the same system path described above for the circuits under analysis. The purpose of this is to verify during each use of this system the accuracy of the automatic TDF file generator 560. The resultant capacitance calculation on the standard test site layout which is done by the design automation analysis tool 580 is verified or compared 590 with the actual known capacitance values 540 which were previously measured and stored in the SPICE model document 510. If the comparison is verified, the custom TDF file 570 and the desired analysis on the desired circuit is released in a report 585. If the comparison is not verified, an error report is issued 575.

Figure 5:
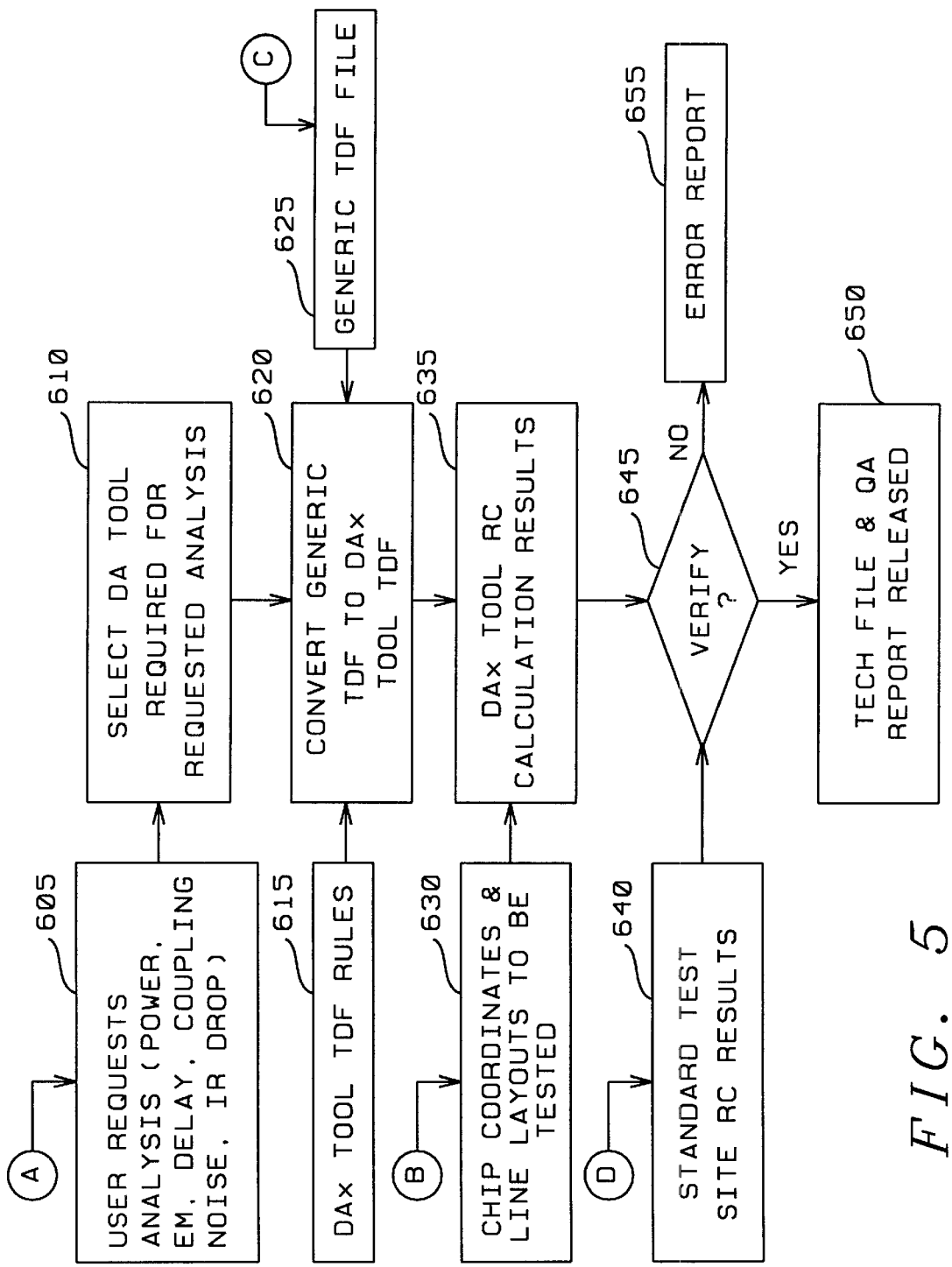
FIG. 5 is a flow diagram of the core method of this invention.

Next, the core method of this invention is shown in FIG. 5. The circuit designer or user requests 605 a particular type of analysis such as noise coupling analysis, power dissipation or timing delay that is to be performed on a given circuit or set of interconnected integrated circuits on a given chip design fabricated at a specific foundry. The required design automation tool is selected 610. A generic technology data file, TDF 625 is presented to the TDF converter 620 along with a set of rules or format 615 for the custom TDF required by the selected analysis tools. The custom TDF generated 620 from the generic TDF, and the chip layout coordinate information 630 describing the reference point and the physical layout of the geometric segments that form the devices and the interconnections of the integrated circuit are submitted to the design automation analysis tool 635 to produce the desired circuit analysis. In addition, the layout information of a standard test site circuit is submitted to the analysis tool. The results of the analysis on this test site circuit are verified 645 or compared to previously measured and calculated test site results 640. If the test site results from the analysis performed by the analysis tool using the custom generated TDF file, match the standard test site results, then the custom TDF file and the resultant analysis are released 650 to the circuit designer. If the test site results from the analysis tool do not match the previously calculated results, an error report is generated 655.

Figure 6:
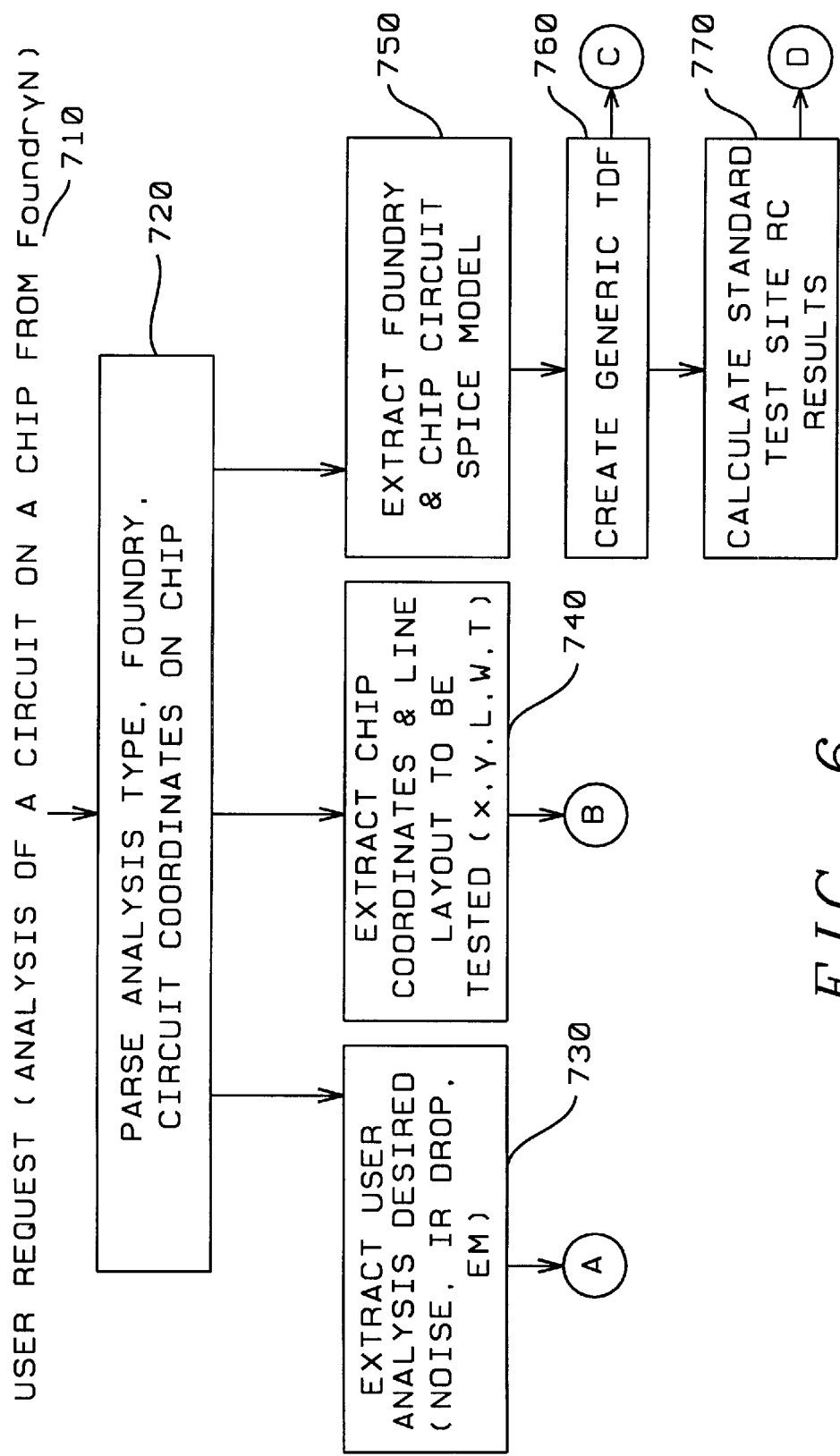
FIG. 6 is a flow diagram of the global method for gathering information which is transferred to the core method of this invention.

FIG. 6 shows the information gathering or front-end portion of the method of this invention. The user or circuit designer requests 710 a certain type of analysis of a specific circuit or set of interconnected circuits on a given integrated circuit chip from a given foundry. The request is parsed or separated into the analysis desired (delay, noise, power, resistance, or capacitance), the foundry/process data, the circuit reference coordinates, and the line segment layout data 720. The use analysis request extracts 730 the desired design automation analysis tool. The chip coordinate reference and the line segment layout information including physical dimensions of wires and devices of the circuits to be analyzed are extracted 740. A circuit simulation model for a circuit simulation program such as the well known SPICE program contains the underlying information about the resistivity and dielectric constants of the materials used in the process of the silicon foundry. Further, the circuit simulation model contains the details of a test circuit or standard test site used to evaluate the performance of devices and elements formed with the semiconductor process. The parsing 720, additionally extracts 750 the circuit simulation model for further processing. The generic TDF file 625 is created 760 and the resistance/capacitance of structures present on the standard test site are calculated 770. The calculating 760 produces the resistance/capacitance results 640.

While this invention has been particularly shown and described with reference to the preferred embodiments thereof, it will be understood by those skilled in the art that various changes in form and details may be made without departing from the spirit and scope of the invention.

The invention claimed is:

1. A method for generating technology data files for use by at least one chip and circuit analysis tools comprising the steps of:

accepting at least one user analysis request for a specific chip and circuit analyses, whereby said specific chip and circuit analyses are selected from a set of analyses comprising power dissipation, electromagnetic noise coupling analysis, resistive voltage drop calculation, and circuit delay calculation;

selecting a design automation tool required for the requested analysis;

converting a standard, generic technology data file(TDF) into a custom TDF specified for said design automation tool using a set of TDF rules for said design automation tool;

extracting chip coordinate references, process parameters and line segment layout data to be tested;

extracting chip coordinate references, process parameters and line segment layout data of a standard wafer test site for a selected foundry/process;

executing the design automation tool using the foundry/process and line segment layout data along with one users analysis request;

executing an analysis specified by said user analysis request with the selected design automation tool using the foundry/process and line segment layout data of the standard wafer test site;

verifying if said analysis performed using the selected design automation tool on the standard test site matches the previously known values for the standard test site;

issuing an error report to a user if the verification of said analysis of the standard test site fails to match the known test site result;

issuing a positive report to the user if the verification said analysis of the standard test site does match the known test site result; and releasing the requested analysis results report if the verification analysis of the standard test site does match the known test site result.

2. The method of claim 1 further comprising the steps of:

providing a user interface to request the analysis type of specific circuit or set of interconnected circuits on a specific integrated circuit chip fabricated at a specific foundry;

separating the requested analysis type, integrated circuit chip, foundry, process parameters and circuit coordinates on the chip;

selecting analysis tool required to deliver the user analysis request;

preparing physical dimensions whereby said physical dimensions are selected from the group of physical dimensions for line lengths and line widths, line thickness, and oxide thickness from the circuit layout data of the circuit or circuits to be analyzed;

extracting foundry and chip a circuit simulation model from the integrated circuit design database;

creating a generic technology data file (TDF) from the circuit simulation model; and extracting predetermined analysis results of a standard test site.

3. An apparatus for generating technology data files for use by a multiplicity of chip and circuit analysis tools comprising:

means for accepting at least one user analysis request for a specific chip and circuit analyses, whereby said specific chip and circuit analyses are selected from a set of analyses comprising power dissipation, electromagnetic noise coupling analysis, resistive voltage drop calculation, and circuit delay calculation;

means for selecting a design automation tool required for the requested analysis;

means for converting a standard, generic technology data file (TDF) into a custom TDF specified for said design automation tool using a set of TDF rules for said design automation tool;

means for extracting chip coordinate references, process parameters and line segment layout data to be tested;

means for extracting line segment layout data of a standard wafer test site for the foundry/process selected;

means for executing the design automation tool using the foundry/process and line segment layout data along with one users analysis request;

means for executing an analysis specified by said user analysis request with the selected design automation tool using the foundry/process and line segment layout data of the standard wafer test site;

means for verifying if said analysis performed using the selected design automation tool on the standard test site matches the previously known values for the standard test site;

means for issuing an error report to the user if the verification of said analysis of the standard test site fails to match the known test site result;

means for issuing a positive report to the user if the verification said analysis of the standard test site does match the known test site result; and means for releasing the requested analysis results report if the verification analysis of the standard test site does match the known test site result.

4. The apparatus of claim 3 for generating technology data files for use by a multiplicity of chip and circuit analysis tools further comprising:

means for providing a user interface to request the analysis type of specific circuit or set of interconnected circuits on a specific integrated circuit chip fabricated at a specific foundry;

means for separating the requested analysis type, integrated circuit chip, foundry, process parameters and circuit coordinates on the chip;

means for selecting analysis tool required to deliver the user analysis request;

means for preparing physical dimensions whereby said physical dimensions are selected from the group of physical dimensions for line lengths and line widths, line thickness, and oxide thickness from the circuit layout data of the circuit or circuits to be analyzed;

means for extracting foundry and chip a circuit simulation model from the integrated circuit design database;

means for creating a generic technology data file (TDF) from the circuit simulation model; and means for extracting predetermined analysis results of a standard test site.

5. A system for generating technology data files for use by at least one chip and circuit analysis tools comprising:

an interface to accept at least one user analysis request for a specific chip and circuit analyses, whereby said specific chip and circuit analyses are selected from a set of analyses comprising power dissipation, electromagnetic noise coupling analysis, resistive voltage drop calculation, and circuit delay calculation; to accept a data file containing chip coordinate references, and line segment layout data, and to accept foundry/process models and data;

a design automation tool selector connected to said interface to select which design automation tool is required for the requested analysis;

a technology data file converter connected to said interface to transform a standard, generic technology data file (TDF) into a custom TDF specified for said design automation tool using a set of TDF rules for said design automation tool;

a data extraction apparatus connected to said interface for extracting chip coordinate references, process parameters and line segment layout data to be tested;

a test site data extraction apparatus said interface for extracting line segment layout data of a standard wafer test site for the foundry/process selected;

the design automation tool connected to the design automation tool selector, the technology data file converter, the data extraction apparatus, and the test site data extraction apparatus, which is executed using the foundry model process data and the line segment layout data as selected by one users analysis request and is further executed using the foundry/process and line segment layout data of the standard wafer test site; and a verification apparatus connected to the design automation tool to verify if said analysis performed using the selected design automation tool on the standard test site matches the previously known values for the standard test site, whereby if the verification of said analysis of the standard test site fails to match the known test site result, said verification apparatus issues an error report indicating said fail, whereby if the verification said analysis of the standard test site does match the known test site result, a positive report is issued indicating said matching, and whereby said verification apparatus releases a requested analysis results report if the verification analysis of the standard test site does match the known test site result.

6. The system of claim 5 further comprising:

an interface dividing apparatus connected to said interface to separate the user analysis request, the data file containing chip coordinate references, and the line segment layout data, and the foundry/process models and data;

physical dimension preparation apparatus connected to the interface dividing apparatus to extract the physical dimensions of the line segments of the circuit as described in the line segment layout data, whereby said physical dimensions are selected from the group of physical dimensions for line lengths and line widths, line thickness, and oxide thickness from the circuit layout data of the circuit or circuits to be analyzed; and a technology data file generator connected to the interface dividing apparatus to create generic technology data file (TDF) from the circuit simulation model.

7. A program retention device containing program instruction code executable on at least one computing device for generating technology data files for use by at least one chip and circuit analysis tools, whereby said program performs the steps of:

accepting at least one user analysis request for a specific chip and circuit analyses, whereby said specific chip and circuit analyses are selected from a set of analyses comprising power dissipation, electromagnetic noise coupling analysis, resistive voltage drop calculation, and circuit delay calculation;

selecting a design automation tool required for the requested analysis;

converting a standard, generic technology data file (TDF) into a custom TDF specified for said design automation tool using a set of TDF rules for said design automation tool;

extracting chip coordinate references, process parameters and line segment layout data to be tested;

extracting line segment layout data of a standard wafer test site for the foundry/process selected;

executing the design automation tool using the foundry/process and line segment layout data along with one users analysis request;

executing an analysis specified by said user analysis request with the selected design automation tool using the foundry/process and line segment layout data of the standard wafer test site;

verifying if said analysis performed using the selected design automation tool on the standard test site matches the previously known values for the standard test site;

issuing an error report to the user if the verification of said analysis of the standard test site fails to match the known test site result;

issuing a positive report to the user if the verification said analysis of the standard test site does match the known test site result; and releasing the requested analysis results report if the verification analysis of the standard test site does match the known test site result.

8. The program retention device of claim 7 further performs the steps of:

providing a user interface to request the analysis type of specific circuit or set of interconnected circuits on a specific integrated circuit chip fabricated at a specific foundry;

separating the requested analysis type, integrated circuit chip, foundry, process parameters and circuit coordinates on the chip;

selecting analysis tool required to deliver the user analysis request;

preparing physical dimensions whereby said physical dimensions are selected from the group of physical dimensions for line lengths and line widths, line thickness, and oxide thickness from the circuit layout data of the circuit or circuits to be analyzed;

extracting foundry and chip a circuit simulation model from the integrated circuit design database;

creating a generic technology data file (TDF) from the circuit simulation model; and extracting predetermined analysis results of a standard test site.

* * * * *